(12) United States Patent
Lin et al.

(10) Patent No.: US 10,777,510 B2
(45) Date of Patent: Sep. 15, 2020

(54) SEMICONDUCTOR DEVICE INCLUDING DUMMY VIA ANCHORED TO DUMMY METAL LAYER

(71) Applicant: TAIWAN SEMICONDUCTOR MANUFACTURING CO., LTD., Hsinchu (TW)

(72) Inventors: Jian-Hong Lin, Yunlin County (TW); Kuo-Yen Liu, Hsinchu County (TW); Hsin-Chun Chang, Taipei (TW); Tzu-Li Lee, Yunlin County (TW); Yu-Ching Lee, Kaohsiung (TW); Yih-Ching Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/396,909

(22) Filed: Jan. 3, 2017

(65) Prior Publication Data

US 2018/0151511 A1    May 31, 2018

Related U.S. Application Data

(60) Provisional application No. 62/426,837, filed on Nov. 28, 2016.

(51) Int. Cl.
| H01L 23/00 | (2006.01) |
| H01L 23/58 | (2006.01) |
| H01L 27/02 | (2006.01) |
| H01L 23/522 | (2006.01) |
| H01L 21/768 | (2006.01) |

(52) U.S. Cl.
CPC .......... *H01L 23/562* (2013.01); *H01L 23/522* (2013.01); *H01L 23/5226* (2013.01); *H01L 23/585* (2013.01); *H01L 27/0248* (2013.01); *H01L 21/76805* (2013.01); *H01L 2224/06519* (2013.01); *H01L 2224/09519* (2013.01); *H01L 2224/30519* (2013.01); *H01L 2224/33519* (2013.01)

(58) Field of Classification Search
None
See application file for complete search history.

(56) References Cited

U.S. PATENT DOCUMENTS

| 6,022,804 | A | * | 2/2000 | Yano | ................ | H01L 23/5226 257/E23.145 |
| 6,946,737 | B2 | * | 9/2005 | Sir | ................ | H01L 23/49827 257/698 |

(Continued)

*Primary Examiner* — Erik Kielin
(74) *Attorney, Agent, or Firm* — McClure, Qualey & Rodack, LLP

(57) ABSTRACT

A semiconductor device and a method of manufacture thereof are provided. The method for manufacturing the semiconductor device includes forming a first dielectric layer on a substrate. Next, forming a first dummy metal layer on the first dielectric layer. Then, forming a second dielectric layer over the first dummy metal layer. Furthermore, forming an opening in the second dielectric layer and the first dummy metal layer. Then, forming a dummy via in the opening, wherein the dummy via extending through the second dielectric layer and at least partially through the first dummy metal layer. Finally, forming a second dummy metal layer on the second dielectric layer and contact the dummy via.

19 Claims, 7 Drawing Sheets

(56) References Cited

U.S. PATENT DOCUMENTS

| | | | |
|---|---|---|---|
| 2001/0029100 A1* | 10/2001 | Huang | H01L 21/76805 438/638 |
| 2005/0017363 A1 | 1/2005 | Lin et al. | |
| 2005/0280120 A1* | 12/2005 | Tomita | H01L 23/522 257/620 |
| 2007/0170486 A1* | 7/2007 | Park | H01L 27/10814 257/306 |
| 2010/0013107 A1* | 1/2010 | Sandhu | H01L 21/76816 257/777 |
| 2010/0032725 A1* | 2/2010 | Baba | G11C 13/0007 257/211 |
| 2011/0156219 A1* | 6/2011 | Kawashima | H01L 22/34 257/620 |
| 2013/0332092 A1* | 12/2013 | Chen | H01L 23/5227 702/58 |
| 2018/0053718 A1* | 2/2018 | Cheng | H01L 23/5226 |

* cited by examiner

SEMICONDUCTOR DEVICE INCLUDING DUMMY VIA ANCHORED TO DUMMY METAL LAYER

RELATED APPLICATIONS

This application claims the priority benefit of U.S. Provisional Application Ser. No. 62/426,837, filed Nov. 28, 2016, which is herein incorporated by reference.

BACKGROUND

The semiconductor industry has experienced exponential growth, and has progressed in pursuit of higher device density, performance, and lower costs. Technological advances in integrated circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Semiconductor devices comprise ICs that are formed on semiconductor wafers by depositing many types of thin films of material over the semiconductor wafers, and patterning the thin films of material to form the integrated circuits. In the manufacturing scheme of an IC, the increased of the multi-integrated layer increase the reliability concerns of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The present disclosure can be more fully understood by reading the following detailed description of the various embodiments, with reference made to the accompanying drawings as follows.

DETAILED DESCRIPTION

Figure 1:
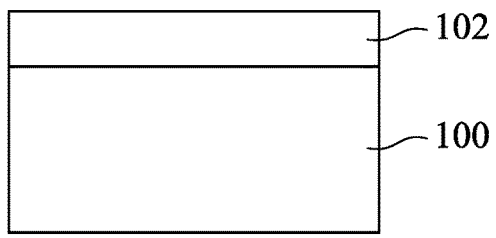
FIGS. 1-4 are cross-sectional views of a method for manufacturing a semiconductor device in accordance with one aspect of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

As used herein, the word "comprise", "include," and variants thereof are intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present technology that do not contain those elements or features.

Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The semiconductor device fabrication is a multiple-step sequence of photolithographic and chemical process steps during which electronic circuits are gradually created on a wafer made of pure semiconductor material. The multiple-step sequence including front-end-of-line (FEOL) processing and back-end-of-line (BEOL) processing. FEOL processing refers to the formation of the transistors directly in the silicon. BEOL processing is the second portion of IC fabrication, where the individual devices (transistors, capacitors, resistors, etc.) get interconnected with multilayer wiring on the wafer. There is a technique that forms a multilayer wiring structure by forming at first such recesses as wiring grooves in an interlayer insulation film, then by filling the recesses with a metal material and by removing the metal material exposed outside the recesses by a Chemical Mechanical Polishing (CMP) process or the like, thereby forming wirings and via-holes. In this technique, if any density difference exists among those formed wirings and via-holes, then hollows and dents referred to as erosion and dishing often comes to appear in the CMP process. This might result in variation of the in-plane film thickness in the CMP process. In order to prevent the occurrence of such erosion and dishing in the CMP process, dummy metals and dummy vias are used. The dummy metals and dummy vias are disposed at a flexible arrangement and are of electrically floating state, which means that they are electrically isolated from other feature on the substrate. The dummy metals are thus provided as layers other than wirings provided to flow a current. Providing such dummy metals and dummy vias makes it easier to manufacture semiconductor devices.

In conventional method, the package strength is improved by changing the material of dielectric or by enhancing the interface of the etch stop layer (ESL) and the extreme low-k dielectric (ELK). Traditional dummy via, which don't have current pass, are arranged for packaging, improving thermal dispersion, improving etch process window, etc. However, traditional dummy via was fully landing on dummy metal layer, which often did not provide enough strength. To address the above-discussed deficiencies, one of the present embodiment providing new types of dummy via, that mount into the dummy metal layer below, thus enhance the interfacial strength of integrated layers. The novel dummy via type can be anchor type, pin type or punch type dummy via. Another aspect of present disclosure providing flexible dummy via arrangement.

Figure 19:
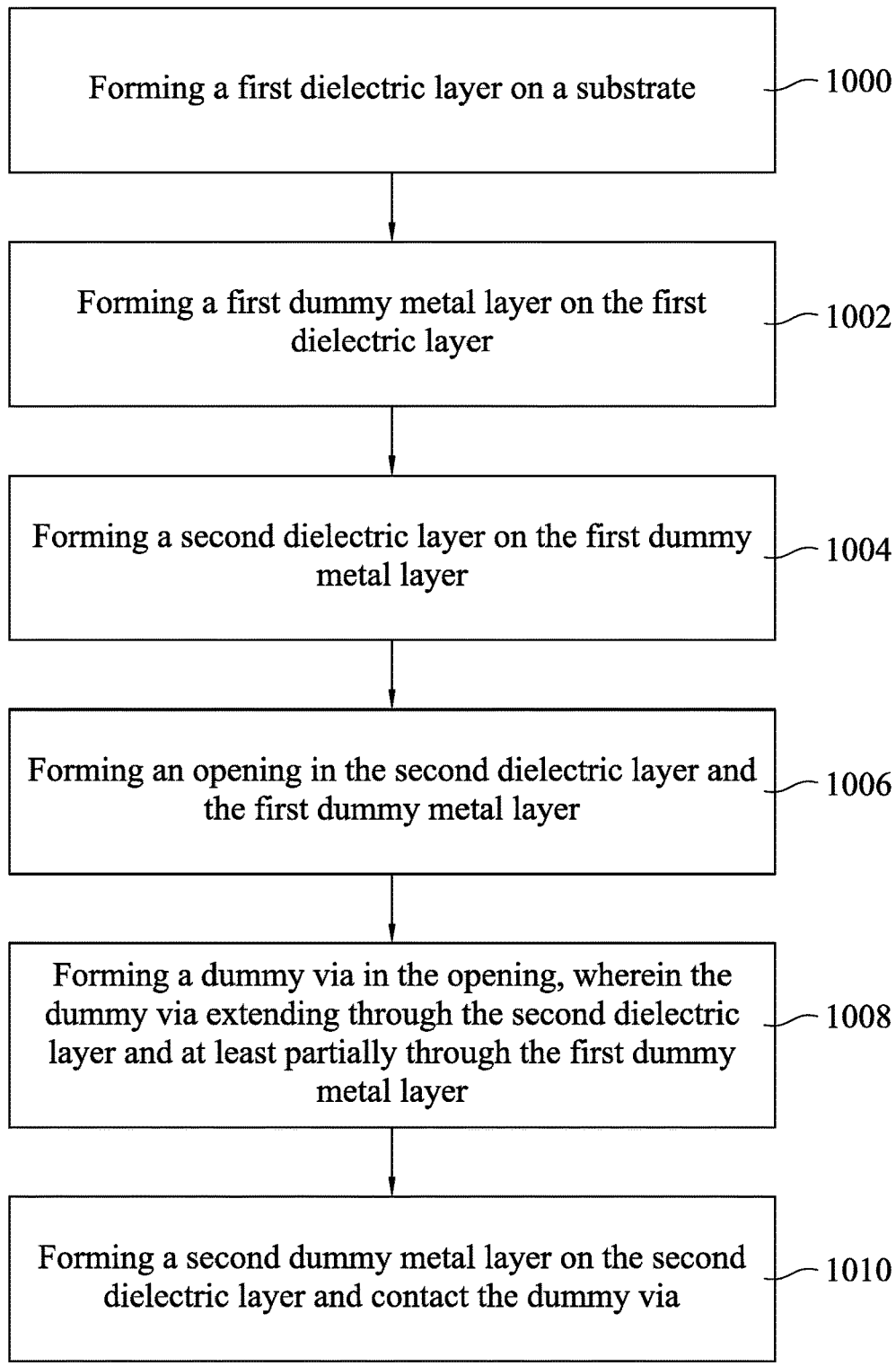
FIG. 19 is a flow chart illustrating a method for manufacturing semiconductor devices according with various embodiments.

FIGS. 1-4 are cross-sectional views when fabricate the semiconductor device 200 according to one aspect of the present disclosure. FIG. 19 is a flow chart illustrating method 900 of manufacturing the semiconductor device according to the embodiments of FIGS. 1-4. Referring to FIG. 1, the semiconductor device including a substrate 100, the substrate 100 may be a bulk silicon substrate. Alternatively, the substrate 100 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the substrates 100 may also include a silicon-on-insulator (SOI) substrate. Generally, an SOI substrate comprises a layer of a semiconductor material such as silicon (Si), germanium (Ge), silicon germanium (SiGe), silicon germanium on insulator (SGOI), or a combination thereof. The SOI substrate is fabricated using separation by implantation of oxygen (SIMOX), wafer bonding, and/or other suitable methods. The substrate 100 may include complementary metal-oxide-semiconductor (CMOS) transistors, microelectromechanical system (MEMS) devices, surface acoustic wave (SAW) devices, optoelectronic devices and other active devices, as well as passive devices, such as resistive and capacitive elements.

The substrate 100 may also include various doped regions. The doped regions may be doped with p-type dopants, such as boron or BF2; n-type dopants, such as phosphorus or arsenic; or combinations thereof. The doped regions may be formed directly on the substrate 100, in a P-well structure, in an N-well structure, in a dual-well structure, or under a raised structure. The substrate 100 may further include various active regions, such as regions configured for an N-type metal-oxide-semiconductor transistor device and regions configured for a P-type metal-oxide-semiconductor transistor device.

Referring again to FIG. 1, method 900 begins from step 1000 by forming a first dielectric layer 102 on the substrate 100. The material of the first dielectric layers 102 may be any suitable material. Examples of the first dielectric material includes but are not limited to silicon oxide, silicon nitride, silicon oxynitride, silicon carbide, fluoride-doped silicate glass, a low-k dielectric material, and a combination thereof. In the embodiment, the material of the dielectric layer 102 can be carbon-containing dielectric materials, and may further contain nitrogen, hydrogen, oxygen, and combinations thereof. Examples of the material of the first dielectric layer 102 include but are not limited to nitrogen-doped silicon carbide (N—SiC), aluminum nitride (AlN), aluminum oxide ($Al_2O_3$), aluminum oxynitride (AlON), or silicon-rich nitride. In an embodiment in which the first dielectric layer 102 comprises an oxide layer, the oxide layer may be formed by any oxidation process, such as wet or dry thermal oxidation in an ambient comprising an oxide, $H_2O$, NO, or a combination thereof.

The first dielectric layer 102 may be formed by any suitable processes, such as deposition. In some embodiments, the first dielectric layers 102 may be formed by a plasma enhanced chemical vapor deposition (PECVD) process, a low-pressure chemical vapor deposition (LPCVD) process, an atmospheric pressure chemical vapor deposition (APCVD) process, spin-on, or sputtering.

A polishing process may be performed after the deposition of the first dielectric layer 102 to planarize upper surfaces. In some embodiments, the polishing process includes a chemical-mechanical-polishing (CMP) process.

Figure 2:
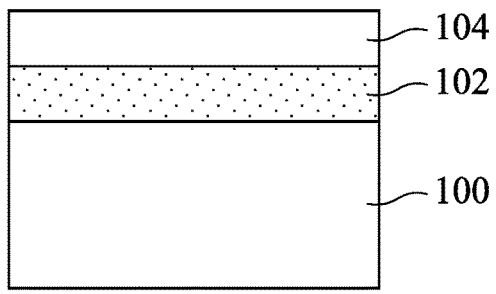

Referring to FIG. 2, method 900 proceeds to step 1002 by forming a first dummy metal layer 104 on the first dielectric layer 102. The first dummy metal layer 104 shown in FIG. 2 operates as a dummy conductive strip or runner, thus there is no electrically connecting among the first dummy metal layer 104 and other features on the substrate. The first dummy metal layer 104 may comprise any type of conductive materials. The conductive material comprises aluminum, copper, tungsten or cobalt in the present disclosure.

The first dummy metal layer 104 may be manufactured using a number of different well-known processes. In one embodiment, the first dummy metal layer 104 may be deposited on the surface of the first dielectric layer 102, for example using a conventional sputter deposition process. The person having ordinary skill in the art is nevertheless understands the processes that might be used to manufacture the first dummy layer 104.

Figure 3:
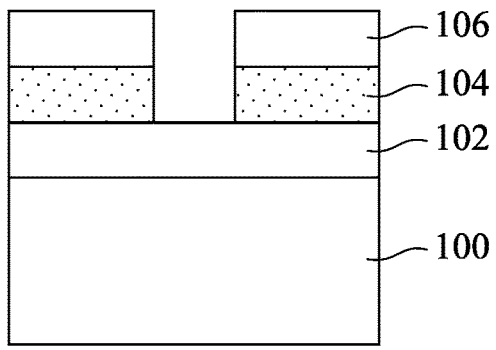

Referring to FIG. 3, method 900 proceeds to step 1004 and step 1006 by forming a second dielectric layer 106 on the first dummy metal layer 104 and by etching the second dielectric layer 106 and the first dummy metal layer 104 to form an opening. In one embodiment, the opening may partially through the first dummy metal layer 104. In another embodiment, the opening may through the first dummy metal layer 104 and expose the first dielectric layer. As for the width of the opening, in one embodiment, the opening in the second dielectric layer 106 may have same width with the opening in the first dummy metal layer 104. In another embodiment, the opening in the second dielectric layer 106 may have larger width compare to the opening in the first dummy metal layer 104. In yet another embodiment, the opening in the second dielectric layer 106 may have smaller width compare to the opening in the first dummy metal layer 104. The opening may not have vertical sidewalls, in an embodiment, the opening in the second dielectric layer 106 and the opening in the first dummy metal layer 104 have a tapered profile with a top width greater than a bottom width. In yet another embodiment, the opening in the second dielectric layer 106 and the first opening in the first dummy metal layer 104 have a widened profile with a top width smaller than a bottom width. The opening is formed by such as dry-plasma etching. The opening has a width between about 20 nm to about 40 nm.

Figure 4:
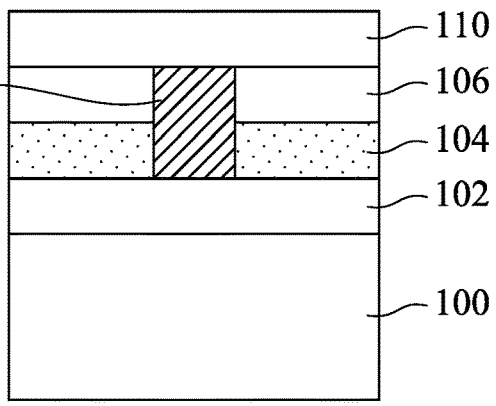

Referring to FIG. 4, method 900 proceeds to step 1008 and 1010 by depositing a conductive material in the opening of the first dummy metal layer 104 and the second dielectric layer 106 and on the second dielectric layer 106. A dummy via 108 is formed in the opening and a second dummy metal layer 110 is formed on the second dielectric layer 106. The dummy via 108 has a first portion disposing above the first dummy metal layer 104 and in the opening of the second dielectric layer 106. The dummy via 108 has a second portion overlapped the sidewalls of the first dummy metal layer 104. In other words, the dummy via 108 extending through the second dielectric layer 106, and at least partially through the first dummy metal layer. The dummy via 108 may be a pin type dummy via or a punch type dummy via.

As mentioned above, the opening may partially through the first dummy metal layer 104 or through the first dummy metal layer 104 and expose the first dielectric layer 102. A first distance D is defined from the interface of the second dielectric layer 106 and the first dummy metal 104 to a bottom of the dummy via 108. The relationship of the first distance D and the first dummy metal layer's thickness T is 0.1×T≤D≤1.5×T. For example, D=0.1×T, 0.3×T, 0.5×T, 0.7×T, 0.9×T, 1×T, 1.3×T or 1.5×T.

Referring again to FIG. 3-4, a second opening may be formed in the second dielectric layer 106 and in the first dummy metal layer 104. A second dummy via is formed in the second opening. The second dummy via extending through the second dielectric layer 106, and at least partially through the first dummy metal layer 104. The second dummy via may be laterally disposed from the horizontal adjacent dummy via 108.

The dummy via 108 and the second dummy metal layer 110 may comprise any type of conductive materials. The conductive material comprises aluminum, copper, tungsten, or cobalt in the present disclosure. The first dummy metal layer 104, the dummy via 108 and the second dummy metal layer 110 may be formed by same conductive material or by different conductive materials. The deposition of conductive material in the opening is performed by process such as chemical-vapor-deposition, sputter deposition, thermal deposition, evaporation, physical vapor transport or other conventional or future-developed processes.

Turning now to FIGS. 5-9, illustrated are cross-sectional views of detailed manufacturing steps how one might manufacture a semiconductor device 500 of another present embodiment.

Figure 5:
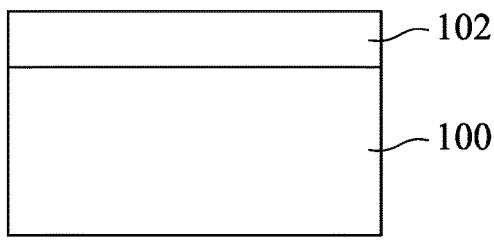
FIGS. 5-9 are cross-sectional views of a method for manufacturing a semiconductor device in accordance with another aspect of present disclosure.

Referring to FIG. 5, the semiconductor device 500 including a substrate 100, the substrate 100 may be a bulk silicon substrate. Alternatively, the substrate 100 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. The material of the dielectric layers 102 may be any suitable material. Examples of the dielectric material includes but are not limited to silicon oxide, silicon nitride, silicon oxynitride, silicon carbide, fluoride-doped silicate glass, a low-k dielectric material, and a combination thereof. The dielectric layer 102 may be formed by any suitable processes, such as deposition. In some embodiments, the dielectric layers 102 are formed by a plasma enhanced chemical vapor deposition (PECVD) process, a low-pressure chemical vapor deposition (LPCVD) process, an atmospheric pressure chemical vapor deposition (APCVD) process, spin-on, or sputtering.

Figure 6:
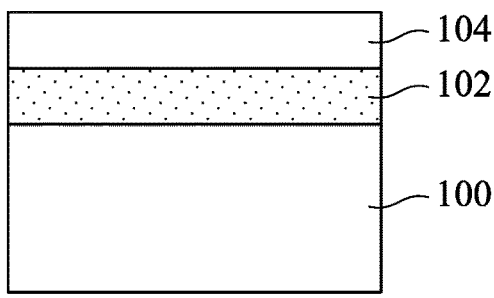

Referring to FIG. 6, illustrated depositing a first dummy metal layer 104 on the first dielectric layer 102. The first dummy metal layer 104 in the embodiment shown in FIG. 6 operates as a dummy conductive strip or runner, thus there is no electrically connecting among the first dummy metal layer 104 and other features on the substrate. In other words, the first dummy metal layer 104 is electrically isolated from other features on the substrate. The first dummy metal layer 104 may comprise any type of conductive material. The conductive material comprises aluminum, copper or tungsten in the present disclosure. The first dummy metal layer 104 may be manufactured using a number of different well-known processes. In one embodiment, the first dummy metal layer 104 may be deposited on the surface of the first dielectric layer 102, for example using a conventional sputter deposition process. The person having ordinary skill in the art is nevertheless understands the processes that might be used to manufacture the first dummy layer 104.

Figure 7:
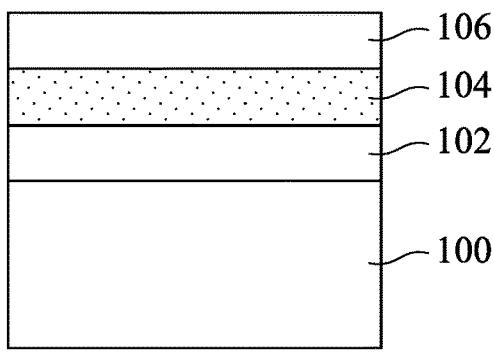

Referring to FIG. 7, illustrated forming a second dielectric layer 106 on the first dummy metal layer 104. The material of the dielectric layers 106 may be any suitable material. Examples of the dielectric material includes but are not limited to silicon oxide, silicon nitride, silicon oxynitride, silicon carbide, fluoride-doped silicate glass, a low-k dielectric material, and a combination thereof.

Figure 8:
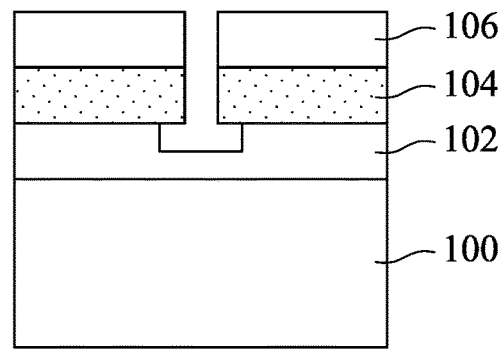

Referring to FIG. 8, illustrated forming an opening in the second dielectric layer 106, the first dummy metal layer 104 and the first dielectric layer 102. The opening has a first portion embedded in the second dielectric layer 106, a second portion through the first dummy metal layer 104, and a third portion partially through the first dielectric layer 102. The first portion and the second portion of the opening have a width between about 20 nm to about 40 nm. In one embodiment, the width of the opening's third portion is larger than the width of the opening's second portion, so that the opening has an anchor shape. The opening may be formed by an anisotropic etching in the second dielectric layer 106 and in the first dummy metal layer 104 and then by an isotropic etching in the first dielectric layer 102.

Figure 9:
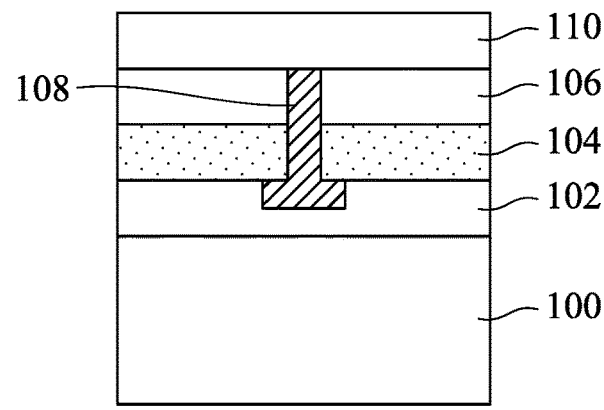

Referring to FIG. 9, illustrated depositing a conductive material in the opening and on the second dielectric layer 106. A dummy via 108 is formed in the opening. A second dummy metal layer 110 is formed on the second dielectric layer 106 and the dummy via 108. The dummy via 108 contacting the first dielectric layer 102 and extending through the first dummy metal layer 104 and the second dielectric layer 106. The dummy via 108 is an anchor type dummy via. The dummy via 108 and the second dummy metal layer 110 may comprise any type of conductive material. The conductive material comprises aluminum, copper or tungsten in the present disclosure. The deposition of conductive material in the opening is performed by processes such as chemical-vapor-deposition, sputter deposition, thermal deposition, evaporation, physical vapor transport or other conventional or future-developed processes.

Turning now to FIGS. 10A-10E, illustrated are top view (FIG. 10A) and cross-sectional views (FIG. 10B-10E) of embodiments of present disclosure.

For clarity of expression, only first dummy metal layer 104, dummy via 108, and second dummy metal layer 110 are shown in FIGS. 10A-10E. The space below the first dummy metal layer 104 and between the first dummy metal layer 104 and the second dummy metal layer 110 may be dielectric material. In FIGS. 10A-10E, the first dummy metal layer 104 has a thickness T. The dummy via 108 has a first portion disposing above the first dummy metal layer 104, extending through the dielectric layer and contacting the second dummy metal layer 110. The dummy via 108 has a second portion overlapped with sidewalls of the opening in the first dummy metal layer 104. The width of the first portion of the dummy via 108 may larger, equal, or smaller than the width of the second portion of the dummy via 108. A first distance D is define from the top surface of the first dummy metal layer 104 to a bottom of the dummy via 108, and $0.1 \times T \leq D \leq 1.5 \times T$. For example, $D=0.1 \times T$, $0.3 \times T$, $0.5 \times T$, $0.7 \times T$, $0.9 \times T$, $1 \times T$, $1.3 \times T$ or $1.5 \times T$.

Figure 10A:
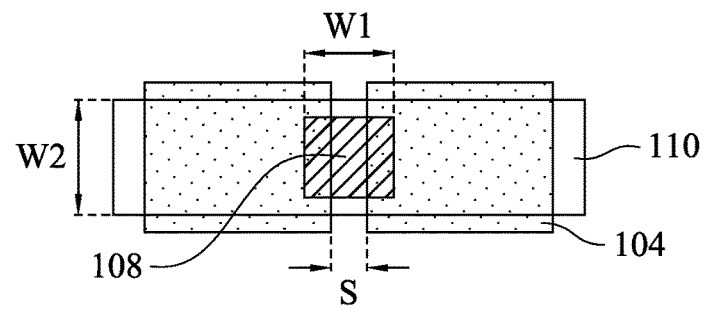
FIG. 10A is a top view of a semiconductor device in accordance with various embodiments.

Referring to FIG. 10A, the opening in the first dummy metal layer 104 comprises a width S in a range of about 5 nm to about 80 nm. The shape of the dummy via 108 can be square, rectangle, slot or circle, and can have different sizes. In one embodiment, the dummy via 108 has a width W1 and a length W2 (as shown in FIG. 10A), and a ratio of W1 to W2 is in a range of about 1 to about 10. For example the ratio of W1 to W2 is equal to 1, 3, 5, 7 or 10. The width of W1 and W2 is between 20 nm to 60 nm.

Figure 10B:
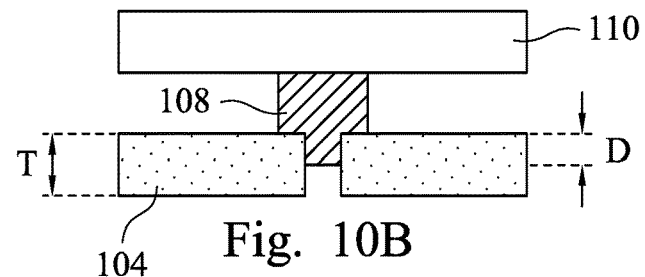
FIG. 10B-10E are cross-sectional views of semiconductor devices in accordance with various embodiments.
Figure 10C:
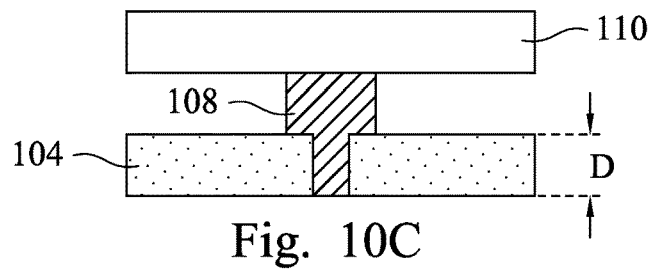
Figure 10D:
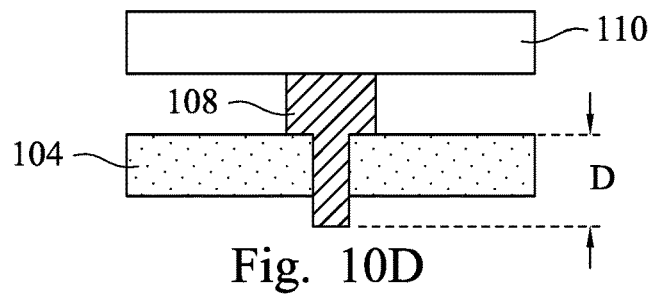
Figure 10E:
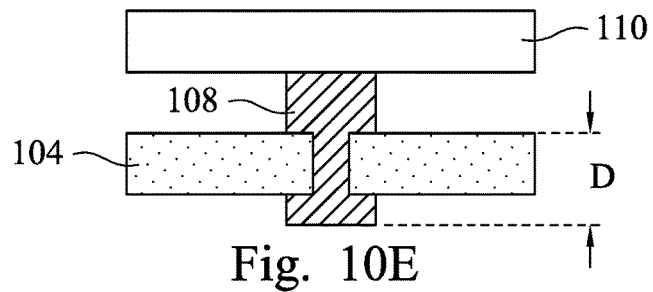

Referring to FIG. 10B, the first distance D from the top surface of the first dummy metal layer 104 to a bottom of the dummy via 108 is about $0.1 \times T$. In FIG. 10C, the first distance D from the top surface of the first dummy metal layer 104 to a bottom of the dummy via 108 is equal to T. In FIG. 10D, the first distance D from the top surface of the first dummy metal layer 104 to a bottom of the dummy via 108 is about $1.5 \times T$. The dummy via 108 is FIG. 10B-10D are pin type dummy via. In FIG. 10E, the dummy via 108 has a third portion below the first dummy metal layer 104. In FIG. 10E, the first distance D from a boundary of the first portion and the second portion of the dummy via 108 to a bottom of the dummy via 108 is about $1.5 \times T$ and the dummy via 108 is an anchor type dummy via.

Turning now to FIGS. 11A-11D, illustrated top view (FIG. 11A) and cross-sectional views (FIG. 11B-11D) of embodiments of another aspect of present disclosure. The main difference of FIGS. 10A-10E and FIGS. 11A-11D is that in FIGS. 11A-11D the dummy via 108 contact one edge of a dummy metal layer 104. This design allows flexibility of dummy via arrangement.

For clarity of expression, only first dummy metal layer 104, dummy via 108, and second dummy metal layer 110 are shown in FIGS. 11A-11D. The space below the first dummy metal layer 104 and between the first dummy metal layer 104 and the second dummy metal layer 110 may be dielectric material. In FIGS. 11A-11D, the first dummy metal layer 104 has a thickness T. The dummy via 108 has a first portion disposing above the first dummy metal layer 104, extending through the dielectric layer and contacting the second dummy metal layer 110. The dummy via 108 has a second portion overlapped with a sidewall of the first dummy metal layer 104. A first distance D is defined from a boundary of the first portion and the second portion of the dummy via 108 to a bottom of the dummy via 108, and $0.1 \times T \leq D \leq 1.5 \times T$. For example, $D=0.1 \times T$, $0.3 \times T$, $0.5 \times T$, $0.7 \times T$, $0.9 \times T$, $1 \times T$, $1.3 \times T$ or $1.5 \times T$.

Figure 11A:
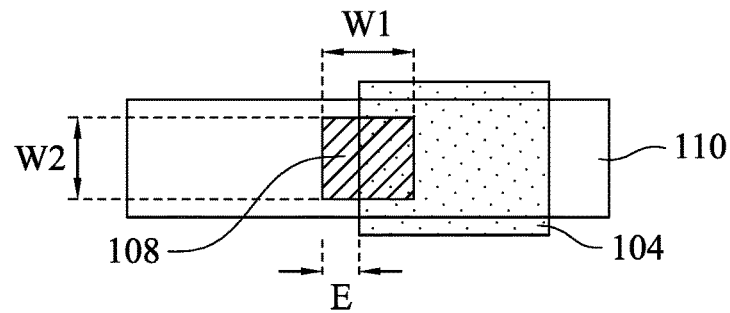
FIG. 11A is a top view of a semiconductor device in accordance with various embodiments.

Referring to FIG. 11A, the dummy via 108 has a width W1 and a portion of the width E not contacting the first dummy metal layer 104, and $0.1 \times W1 \leq E \leq 0.9 \times W1$. In one embodiment, the dummy via has a width W1 and a length W2, and a ratio of W1 to W2 is in a range of about 1 to about 10. For example the ratio of W1 to W2 is equal to 1, 3, 5, 7 or 10. The shape of the dummy via 108 can be square, rectangle or circle, and can have different sizes.

Figure 11B:
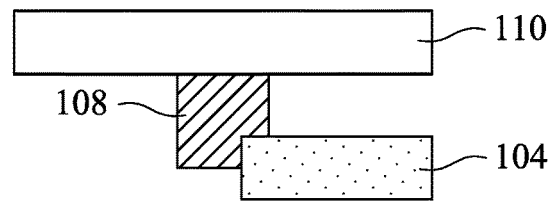
FIGS. 11B-11D are cross-sectional views of semiconductor devices in accordance with various embodiments.
Figure 11C:
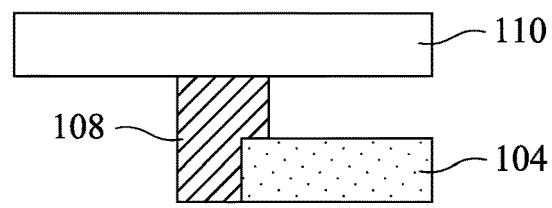
Figure 11D:
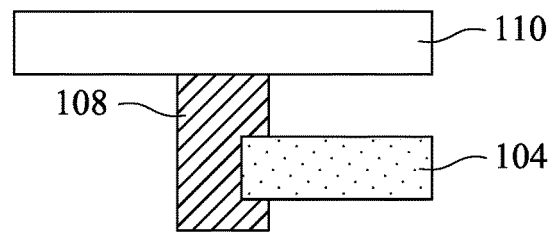

Referring to FIG. 11B, the first distance D from the top surface of the first dummy metal layer 104 to a bottom of the dummy via 108 is about $0.1 \times T$. In FIG. 11C, the first distance D from the top surface of the first dummy metal layer 104 to a bottom of the dummy via 108 is equal to T. In FIG. 11D, the first distance D from the top surface of the first dummy metal layer 104 to a bottom of the dummy via 108 is about $1.5 \times T$.

Turning now to FIGS. 12-18, illustrated top view of embodiments of present disclosure. In FIGS. 12-18, dummy via 108 and dummy via 112 is sandwiched between first dummy metal layer 104 and second dummy metal layer 110.

Figure 12:
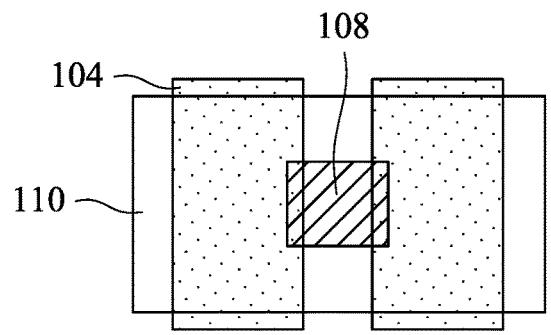
FIGS. 12-18 are top views of semiconductor devices in accordance with various embodiments.
Figure 13:
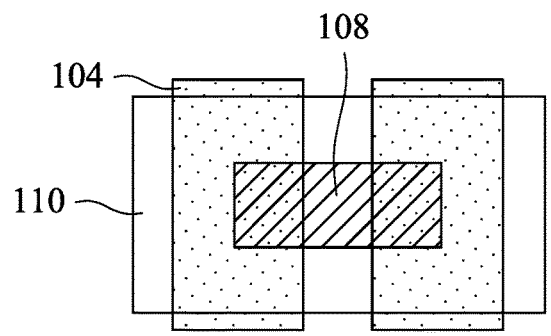
Figure 14:
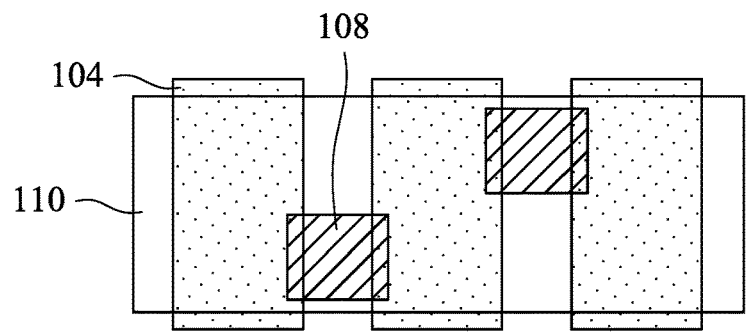
Figure 15:
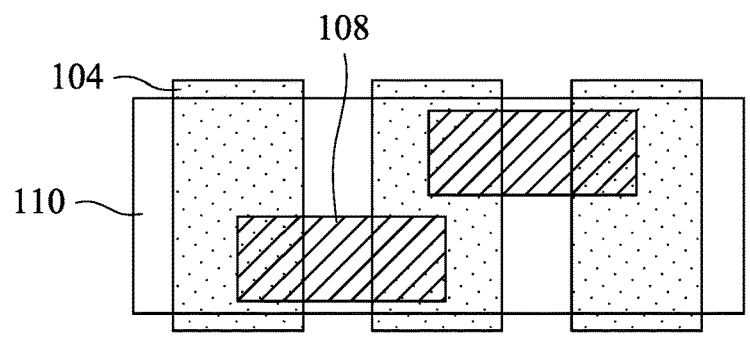
Figure 16:
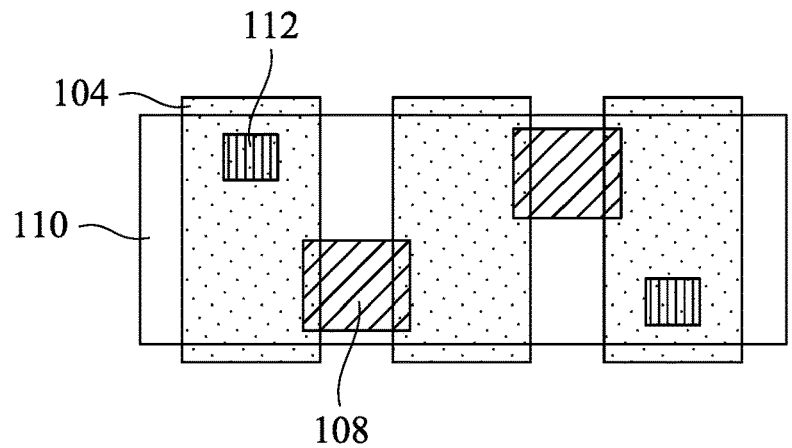
Figure 17:
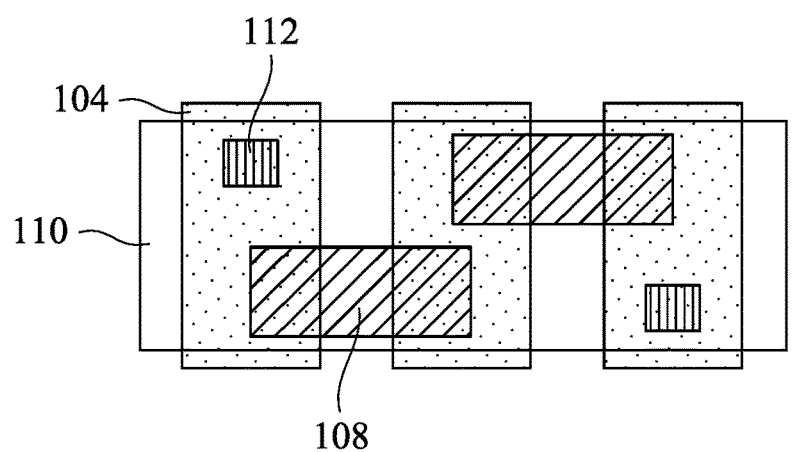
Figure 18:
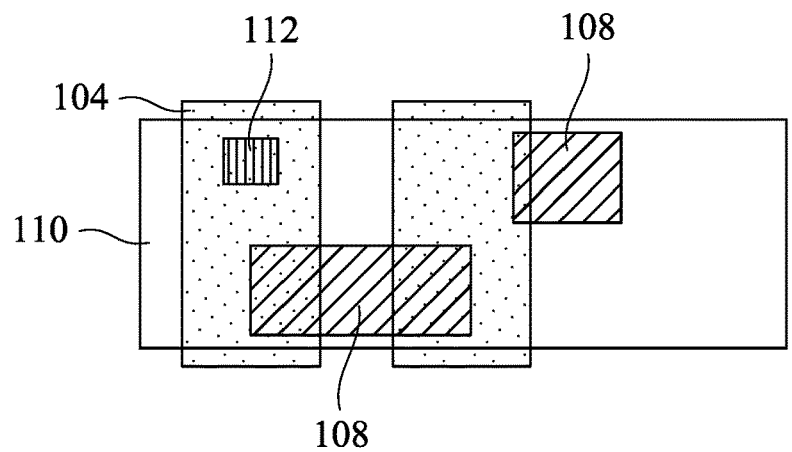

FIG. 12 shown a square dummy via 108. FIG. 13 shown a rectangular dummy via 108. FIG. 14 shown square dummy via 108 laterally disposed from horizontally adjacent square dummy via 108. FIG. 15 shown rectangular dummy via 108 laterally disposed from horizontally adjacent rectangular dummy via 108. FIG. 16 shown in addition to square dummy via 108, further comprising two traditional dummy vias 112. Traditional dummy via 112 are via that fully landing on the dummy metal. In other words, traditional dummy via are via that on the dummy metal, which does not have opening. The combination arrangement of traditional dummy via 112 makes the design more flexible. FIG. 17 shown in addition to rectangular dummy vias 108 in FIG. 15, further comprising two traditional dummy vias 112. FIG. 18 shown that one of the dummy vias 108 contacts only one dummy metal layer 104. The design of the dummy via 108 in FIG. 18 makes the arrangement more flexible.

In accordance with some embodiments, the present disclosure discloses a semiconductor device. The semiconductor device comprises a first dielectric layer on the substrate and a first dummy metal layer on the first dielectric layer. A second dielectric layer overlying the first dummy metal layer and a dummy via in the first dummy metal layer and the second dielectric layer.

In accordance with some embodiments, the present disclosure discloses a semiconductor device. The semiconductor device comprises a first dielectric layer on the substrate. A first dummy metal layer on the first dielectric layer and has a thickness T. A second dielectric layer on the first dummy metal layer and a second dummy metal layer on the second dielectric layer. A dummy via, wherein the dummy via comprises a first portion disposing above the first dummy metal layer, extending through the second dielectric layer and contacting the second dummy metal layer. A second portion embedded in the first dummy metal layer. A first distance D, wherein the first distance D is from a boundary of the second dielectric layer and the first dummy metal layer to a bottom of the dummy via, and $0.1 \times T \leq D \leq 1.5 \times T$.

In accordance with various embodiments, the present disclosure discloses a method of manufacturing a semiconductor device. The method includes forming a first dielectric layer on a substrate and forming a first dummy metal layer on the first dielectric layer. Then, forming a second dielectric layer on the first dummy metal layer. Forming an opening in the second dielectric layer and the first dummy metal layer. Next, forming a dummy via in the opening, wherein the dummy via extending through the second dielectric layer and at least partially through the first dummy metal layer. Finally, forming a second dummy metal layer on the second dielectric layer and contact the dummy via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a first dielectric layer on the substrate;
a dummy metal layer on the first dielectric layer, wherein the dummy metal layer has horizontally-separated first, second, and third portions, and the horizontally-separated first, second, and third portions of the dummy metal layer are aligned along a first direction;
a second dielectric layer overlying the dummy metal layer;
a first dummy via anchored between the horizontally-separated first and second portions of the dummy metal layer, and in the second dielectric layer; and the first dielectric layer, wherein a cross-section of the first dummy via in a vertical direction has a first width in the first dielectric layer, a second width in the second dielectric layer, and a third width in the dummy metal layer, the first width is substantially equal to the second width, and the third width is less than the first width; and
a second dummy via anchored between the horizontally-separated second and third portions of the dummy metal layer, wherein at least a portion of the first dummy via and at least a portion of the second dummy via are aligned along a second direction that is substantially orthogonal to the first direction.

2. The semiconductor device of claim 1, wherein the first dummy via extends through the dummy metal layer.

3. The semiconductor device of claim 1, wherein the second dummy via extends through the second dielectric layer and at least partially through the dummy metal layer.

4. The semiconductor device of claim 1, wherein the dummy metal layer is electrically floating.

5. The semiconductor device of claim 1, wherein the first dummy via is electrically floating.

6. The semiconductor device of claim 1, further comprising a third dummy via in the second dielectric layer and extending to, but not through, the dummy metal layer, wherein the third dummy via is misaligned with the second dummy via.

7. A semiconductor device, comprising:
a substrate;
a first dielectric layer on the substrate;
a first dummy metal layer disposed on the first dielectric layer and having a thickness T, wherein the first dummy metal layer has horizontally-separated first and second portions that are aligned along a direction;
a second dielectric layer on the first dummy metal layer;
a second dummy metal layer on the second dielectric layer;
a first dummy via anchored between the horizontally-separated first and second portions of the first dummy metal layer, wherein the first dummy via comprises:
a first portion above the first dummy metal layer, embedded in the second dielectric layer, and contacting the second dummy metal layer, wherein a top surface of the first portion of the first dummy via is substantially rectangular;
a second portion embedded in the first dummy metal layer, wherein a first distance D is from a boundary of the second dielectric layer and the first dummy metal layer to a bottom of the first dummy via, and $D>T$; and
a third portion wider than the first and second portions of the first dummy via, wherein the third portion of the first dummy via extends into, but not through, the first dielectric layer; and
a second dummy via in the second dielectric layer and extending to, but not through, the first portion of the first dummy metal layer, wherein the first dummy via and the second dummy via are misaligned along the direction.

8. The semiconductor device of claim 7, wherein the first dummy metal layer extends beyond an entire width of the second dummy metal layer.

9. The semiconductor device of claim 7, wherein the second dummy metal layer extends beyond an entire width of the first dummy metal layer.

10. The semiconductor device of claim 7, wherein the second dummy metal layer has a first sidewall and a second sidewall opposite the first sidewall, and the first dummy metal layer extends at least from a first position directly below the first sidewall of the second dummy metal layer beyond a second position directly below the second sidewall of the second dummy metal layer.

11. The semiconductor device of claim 7, wherein the second dummy metal layer is electrically floating.

12. A semiconductor device, comprising:
a first dielectric layer on a substrate;
a first metal layer on the first dielectric layer, wherein the first metal layer has horizontally-separated first, second, and third portions, and the horizontally-separated first, second, and third portions of the first metal layer are aligned along a direction;
a first via anchored between the horizontally-separated first and second portions of the first metal layer, in the first dielectric layer, and having a bottom surface in contact with the first dielectric layer, wherein the first via has a first portion between the horizontally-separated first and second portions of the first metal layer and a second portion in the first dielectric layer, and the first portion of the first via has a height greater than a height of the second portion of the first via; and a second via anchored between the horizontally-separated second and third portions of the first metal layer, wherein the first via and the second via are misaligned along the direction.

13. The semiconductor device of claim 12, wherein the first via is in contact with a top surface of the first metal layer.

14. The semiconductor device of claim 12, wherein the first via is further in contact with a bottom surface of the first metal layer.

15. The semiconductor device of claim 12, wherein a portion of the first metal layer is embedded in the first via.

16. The semiconductor device of claim 12, wherein the first via further has a third portion above the first metal layer, and the first metal layer is between the third portion and the first dielectric layer.

17. The semiconductor device of claim 12, wherein the first portion of the first metal layer has a first sidewall and a second sidewall opposite the first sidewall of the first portion of the first metal layer, and the second portion of the first metal layer has a first sidewall facing the first sidewall of the first portion of the first metal layer and a second sidewall opposite the first sidewall of the second portion of the first metal layer; and further comprising:
a second metal layer on the first via and extending at least from a first position directly above the second sidewall of the first portion of the first metal layer beyond a second position directly above the second sidewall of the second portion of the first metal layer.

18. The semiconductor device of claim 12, wherein the first portion of the first metal layer has a first sidewall and a second sidewall opposite the first sidewall of the first portion of the first metal layer, and the second portion of the first metal layer has a first sidewall facing the first sidewall of the first portion of the first metal layer and a second sidewall opposite the first sidewall of the second portion of the first metal layer; and further comprising:
a second metal layer on the first via and extending at least from a first position directly above the second sidewall of the first portion of the first metal layer beyond a second position directly above the second sidewall of the second portion of the first metal layer through a third position directly above the first sidewall of the first portion of the first metal layer and through a fourth position directly above the first sidewall of the second portion of the first metal layer.

19. The semiconductor device of claim 12, further comprising a third via extending to, but not through, the third portion of first metal layer, wherein the second via and the third via are misaligned along the direction.

* * * * *